United States Patent
Song

(10) Patent No.: US 7,991,103 B2
(45) Date of Patent: Aug. 2, 2011

(54) SYSTEMS AND METHODS FOR DATA RECOVERY IN AN INPUT CIRCUIT RECEIVING DIGITAL DATA AT A HIGH RATE

(75) Inventor: Hongjiang Song, Mesa (AZ)

(73) Assignee: Intel Corporation, Santa Clara, CA (US)

(*) Notice: Subject to any disclaimer, the term of this patent is extended or adjusted under 35 U.S.C. 154(b) by 869 days.

(21) Appl. No.: 11/901,782

(22) Filed: Sep. 19, 2007

(65) Prior Publication Data

US 2009/0074126 A1 Mar. 19, 2009

(51) Int. Cl.
*H03D 3/24* (2006.01)
*H04L 7/00* (2006.01)

(52) U.S. Cl. ........................... 375/376; 375/354

(58) Field of Classification Search ............. 375/376, 375/373, 371, 354
See application file for complete search history.

(56) References Cited

U.S. PATENT DOCUMENTS

| | | | |
|---|---|---|---|
| 2003/0200490 A1* | 10/2003 | Goudie | 714/704 |
| 2006/0142061 A1* | 6/2006 | Steffan | 455/557 |
| 2007/0063741 A1* | 3/2007 | Tarango et al. | 327/31 |
| 2007/0147569 A1* | 6/2007 | Chang et al. | 375/373 |

* cited by examiner

*Primary Examiner* — Dac V Ha
*Assistant Examiner* — Brian J Stevens
(74) *Attorney, Agent, or Firm* — Schubert Law Group, PLLC; Jeffrey S. Schubert

(57) ABSTRACT

Embodiments include systems and methods for recovery of data from an incoming digital data stream. Embodiments comprise a fine tracking loop to track the data when the phase between the incoming data and the receiver clock varies relatively slowly. Embodiments comprise a fast tracking loop performs to track the data when the phase between the incoming data and the receiver clock varies rapidly. The fine tracking loop adjusts the phase of a receiver clock to track the data eye of the data. The fast tracking loop over-samples the data and then chooses the sample that best represents the data. In some embodiments, the data recovery circuit can switch between receiving data from the fine tracking loop and receiving data from the fast tracking loop.

20 Claims, 4 Drawing Sheets

SYSTEMS AND METHODS FOR DATA RECOVERY IN AN INPUT CIRCUIT RECEIVING DIGITAL DATA AT A HIGH RATE

FIELD

This written description relates to the field of digital data recovery in an input circuit. More particularly, the written description relates to the field of fast tracking and fine tracking in a Data Recovery Circuit (DRC).

BACKGROUND

Many digital machines or devices, such as computers and servers, require high speed reception of digital data. Accordingly, Input/Output (I/O) circuits must be able to recover digital data from a received signal at a very high data rate. When a digital data signal is received by a receiving system, the clock of the system which generated the data may vary in frequency and phase from the clock of the receiving system. If the receiving circuit does not compensate for these variations, errors will occur in determining the received data. Accordingly, an I/O circuit comprises a Data Recovery Circuit (DRC) that recovers the digital data in the presence of these variations.

Two major DRC architectures are used in existing I/O circuits. One is the phase interpolator (PI) based DRC architecture, found in first and second generation Peripheral Component Interface (PCI)—express I/O circuits. The other architecture is the over-sampling DRC, found in Universal Serial Bus (USB) 2.0 I/O circuits. A PI based DRC adaptively adjusts the receiver reference clock based on the received data phase so that the receiver clock tracks the center of the incoming data eye. In contrast, the over-sampling DRC over-samples the incoming digital data and chooses which sample of the over-sampled data best represents the data.

DETAILED DESCRIPTION OF EMBODIMENTS

Figure 1:
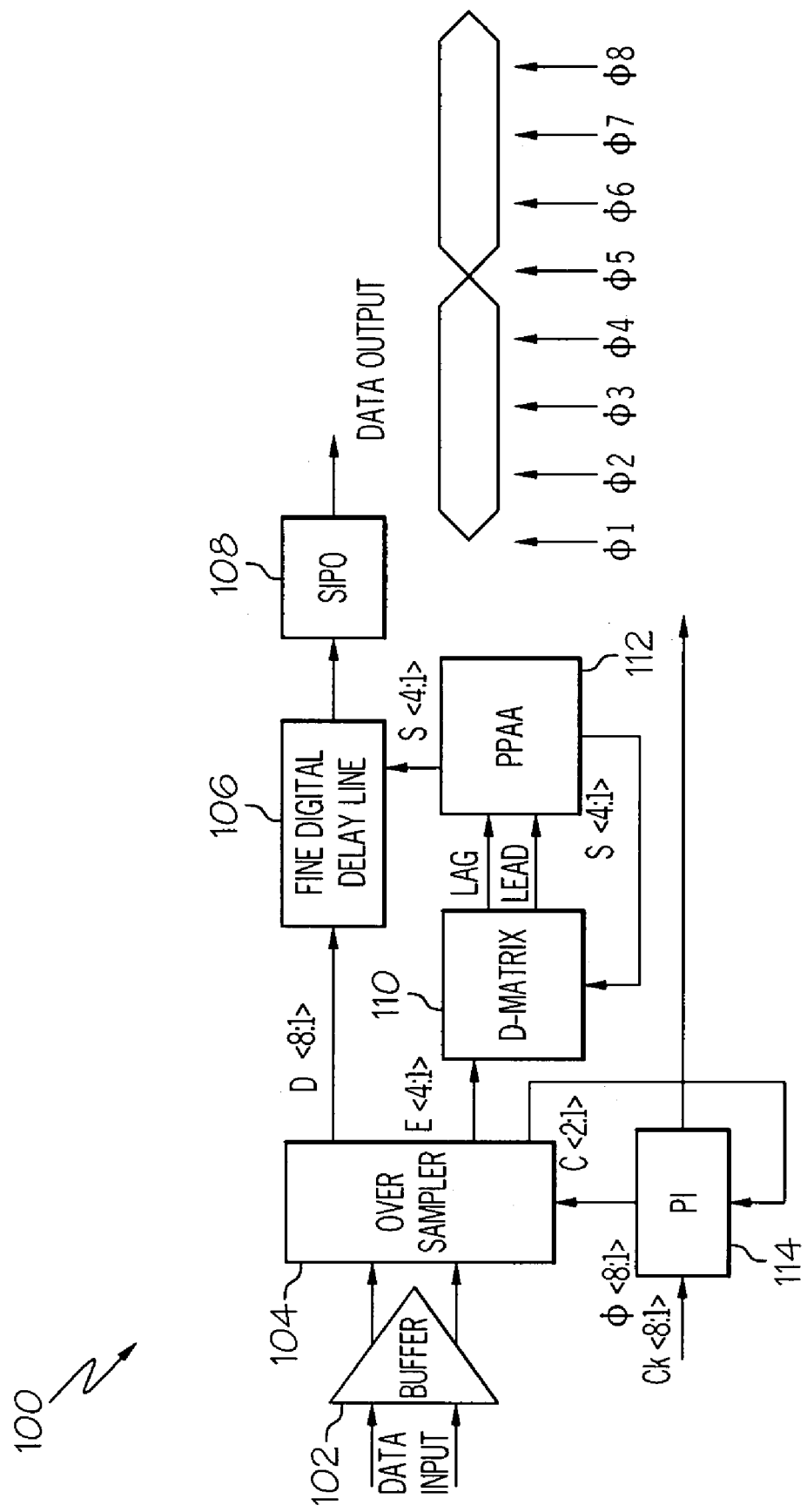
FIG. 1 depicts an embodiment of a dual loop Data Recovery Circuit.

The following is a detailed description of embodiments of the invention depicted in the accompanying drawings. The embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Embodiments include systems and methods for recovery of data from an incoming digital data stream. Embodiments comprise a fine tracking loop to track the data when the phase between the incoming data and the receiver clock varies relatively slowly. Embodiments comprise a fast tracking loop performs to track the data when the phase between the incoming data and the receiver clock varies rapidly. The fine tracking loop adjusts the phase of a receiver clock to track the data eye of the data. The fast tracking loop over-samples the data and then chooses the sample that best represents the data. In some embodiments, the data recovery circuit can switch between receiving data from the fine tracking loop and receiving data from the fast tracking loop.

As mentioned, there are two major DRC architectures used in existing I/O circuits. A PI based DRC adaptively adjusts the receiver reference clock based on the received data phase so that the receiver clock tracks the center of the incoming data eye. In contrast, the over-sampling DRC over-samples the incoming digital data and chooses which sample of the over-sampled data best represents the data.

An attractive feature of a Phase Interpolator (PI) based data recovery circuit its potential high phase adjustment accuracy (e.g. 6.6 pico-seconds (ps) in the 2nd generation PCI-Express application) using only 2 samples per unit interval (UI). This yields low input loading and power dissipation for circuit implementations of the PI method. However the PI-based DRC circuits suffer from inherent limitations due to high DRC loop latency (typically >4~16 control clock cycles) caused by the PI circuit within the DRC loop. Such high loop latency imposes severe limitations on the achievable DRC jitter tracking bandwidth (e.g., ~10 Mhz maximum loop bandwidth for the 2nd generation PCI-Express). As a result, the reference clock jitter at the output of the reference clock Phase Locked Loop (PLL) (which has similar loop bandwidth) cannot be effectively filtered. This contributes to the link jitter budget.

The PI based DRC also suffers from other undesired effects such as PI output clock ditching caused by the long DRC latency, and PI dynamic phase error. These non-ideal effects alone contribute to an additional 25~45 ps jitter content in the PI based DRC loop, which significantly limits the performance of I/O based on this DRC architecture. In short, the PI based DRC performs well when there is low frequency jitter, but does not perform well when there is high frequency jitter.

On the other hand, the over-sampling DRC architectures, which are based on full digital implementation, offer extremely short loop latency (usually within 1 data UI) and very high achievable jitter tracking bandwidth (usually >100 Mega Hertz (Mhz)). The short loop latency eliminates the ditching problems that occur in the PI based DRC circuit. The high jitter tracking bandwidth provides significant filtering of the jitter in the reference clock. As a result, this DRC architecture exhibits significant improvement in performance compared with the PI-based DRC circuit.

A major limitation of the over-sampling DRC circuit, however, is the relatively high phase quantization error resulting from the limitation of a maximum allowed over-sampling ratio in practical I/O circuits. More samples and finer clock phase are in general required for better phase tracking resolution in the over-sampling DRC architecture. But this results in higher power dissipation.

FIG. 1 shows a dual loop DRC circuit that provides benefits of both aforementioned types of DRC circuits. The DRC circuit of FIG. 1 comprises two phase tracking loops: a fine phase tracking loop and a fast phase tracking loop. The fine tracking loop employs a PI-based DRC circuit mechanism, which provides high resolution phase and low bandwidth phase tracking capability. The fast tracking loop, on the other hand, employs a reduced over-sampling ratio over-sampling DRC circuit mechanism, which provides low latency, high bandwidth jitter tracking capability. The fine tracking loop comprises over-sampler 104 and phase interpolator 114. The fast tracking loop comprises fine digital delay line 106, Serial Input/Parallel Output (SIPO) 108, Decision Matrix 110, and Parallel Phase Accumulation Adder (PPAA) 112. In one embodiment, data is received from the fine tracking loop when there is low jitter, and data is received from the fast tracking loop when there is high jitter.

In an embodiment, a buffer 102 amplifies the incoming data and passes this data to an over-sampler 104. Over-sampler 104 over-samples the data. In the embodiment shown, the data is over-sampled by a factor of 4 per Unit Interval (UI). In other embodiments, the data is over-sampled by a factor of 2, as for the PCI-express I/O application. The over-sampled data, D<8:1>, is passed to Fine Digital Delay Line 106. Fine Digital Delay Line 106 receives the phase selection code, S<4:1>, to select the optimal sample of the 8 samples received from Over-sampler 104. An SIPO reduces the data rate before output to the receiving system. The phase selection code, S<4:1>, is determined by PPAA 112 according to an algorithm for selecting the sample that best represents the data.

In the fine phase tracking loop, samples of the data are used to determine the lead and lag of the receiver reference clock from the PI 114 with respect to the input data phase (center of the eye). This can be implemented in exactly the same way as the existing PI-DRC. The fine tracking loop causes the receiver clock from the PI to be closely aligned to the center of the data eye of the incoming data.

In the fast phase tracking loop, the over-sampled input data stream is used to extract the data phase E<4:1> for each UI. This phase signal is then used to generate the optimal data selection signal S<4:1> based on a Digital Signal Processing (DSP)-based control loop using the decision matrix (D-Matrix) 110 and the parallel phase accumulation adder (PPAA) 112. Note that the PPAA which can be implemented in the same way as in the existing over-sampling-DRC circuits). The optimal data selected by this fast loop is passed to the SIPO 108 to be converted to parallel data bits for the core circuit of the receiving system, thereby converting a high data rate to a relatively low data rate.

Figure 2:
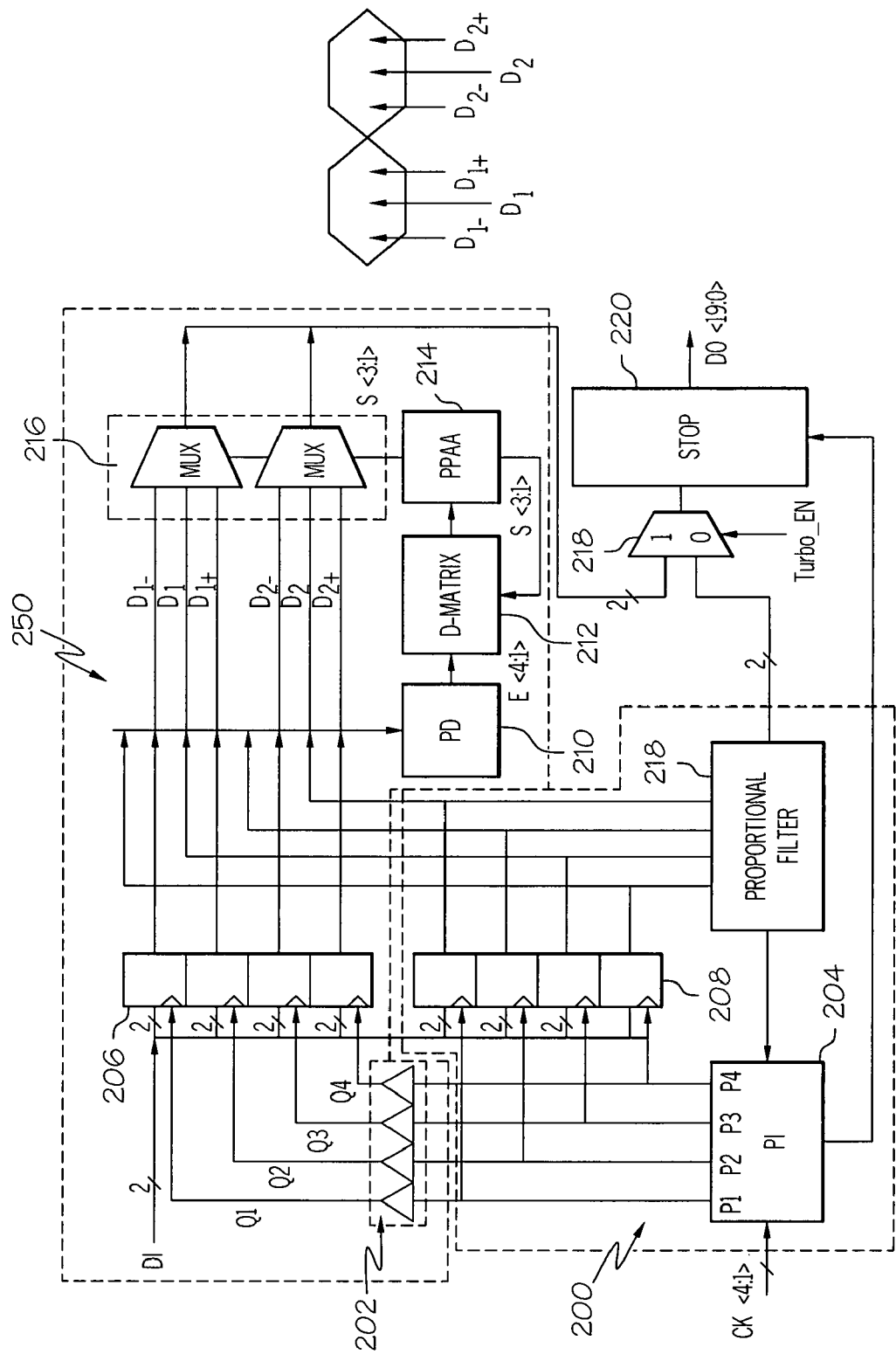
FIG. 2 depicts an embodiment of a dual loop Data Recovery Circuit that provides substantial use of existing Phase Interpolator circuitry.

FIG. 2 shows a turbo-DRC circuit implementation based on the above-described dual loop DRC architecture. This implementation seeks to achieve maximum reuse of existing PI-DRC circuitry for higher performance at low design overhead and low risk. In this circuit, a turbo-loop (fast loop) circuit 250 is added to an existing Phase Interpolator-based PCI-Express DRC circuit that forms the Fine Tracking Loop 200. The turbo-DRC circuits include a delay buffer block 202 which generates additional 4-phase over-sampling clocks by delaying the original 4-phase clocks from the PI 204. The delay may be achieved using a matched-delay line or a highly simplified DLL (Delay Locked Loop). Four samplers 206 are added to work with the original 4 samplers 208 to generate the over-sampling data for the turbo-DRC operation. Other numbers of samplers may be employed. In the fine tracking loop, the 4 samples from samplers 208 are passed through a proportional filter 218 to produce a control signal for PI 204 to complete the fine tracking loop.

The 8 over-sampled data (4 data per UI, 2 UI at a time) are used in the phase detector (PD) 210 to extract the phase information, E<4:1>, of the input data bits. In decision matrix 212, this phase information is used with the feedback of the previous data selection control code S<3:1> from the PPAA 214 to generate the optimal data selection control signal S<3: 1> based on the fast-DRC loop. The optimal data selection is determined according to an algorithm implemented in the PPAA. The data selection control S<3:1> is used to pick the best data from the over-sampled (redundant) data ($D_{1-}$, $D_1$, $D_{1+}$) and ($D_{2-}$, $D_2$, $D_{2+}$). Thus, S<3:1> is used to control multiplexers 216 to select the optimal data. Such a data selection technique can effectively handle the data error due to high frequency data eye shift which can not be tracked using the PI-based DRC circuit. This yields significant improvement in the jitter margin of the high-speed I/O circuits.

The outputs of the multiplexers 216 and proportional filter 218 are input to a multiplexer 218. When turbo is not enabled, the output of the proportional filter 218 is fed to SIPO 220. When turbo is enabled, the output of multiplexers 216 is fed to SIOP 220. Thus, a fine tracking loop comprises a set of samplers, a phase interpolator, and a filter. The fast tracking loop comprises a delay buffer, a set of samplers, a phase detector, a decision matrix, a PPAA and multiplexers. The fast tracking loop overcomes high frequency jitter while the fine tracking loop provides high accuracy phase tracking when high frequency jitter is not present in the incoming data.

Accordingly, embodiments comprise a data recovery circuit for receiving and recovering high speed digital data. The data recovery circuit comprises a receiver clock to produce a local clock signal to sample the incoming digital data to produce a first set of samples and a second set of samples. The DRC also comprises a fast tracking loop to recover data by choosing a preferred one of the samples of the first and second set of samples. The DRC further comprises a fine tracking loop to recover data by dynamically adjusting the receiver reference clock based on a received data phase of the first set of samples so that the receiver clock tracks an approximate center of a data eye of the data.

In one embodiment, the fast tracking loop comprises a delay buffer to generate the second set of samples by delaying the clocks of the receiver clock. The fast tracking loop comprises extra samplers to generate the second set of samples of the incoming digital data. A phase detector extracts phase information from the sampled data. A decision matrix receives the phase information and produces a lead signal or a lag signal to the parallel phase accumulation adder. The parallel phase accumulation adder PPAA generates the optimal data selection control signal to select the preferred sample of the first and second set of samples according to an algorithm implemented by the PPAA. Multiplexers receive the optimal data selection control signal which selects a sample deemed to best represent the incoming data in a unit interval according to the optimal data selection control signal. In one embodiment, the fine tracking loop comprises a phase interpolator to adjust the phase of the receiver clock. A proportional filter filters the sampled data and produces a control signal for the phase interpolator.

Also, in some embodiments, the DRC comprises a mode switch to switch between outputting data from the fast tracking loop and outputting data from the fine tracking loop. The fine tracking loop performs well when the phase between the incoming data and the receiver clock varies relatively slowly. The fast tracking loop performs well when the phase between the incoming data and the receiver clock varies rapidly. Thus, in some embodiments, the mode switch selects data from the fast tracking loop when there is high jitter in the received incoming data, and the mode switch selects data from the fine tracking loop when there is not high jitter in the received incoming data.

Figure 3:
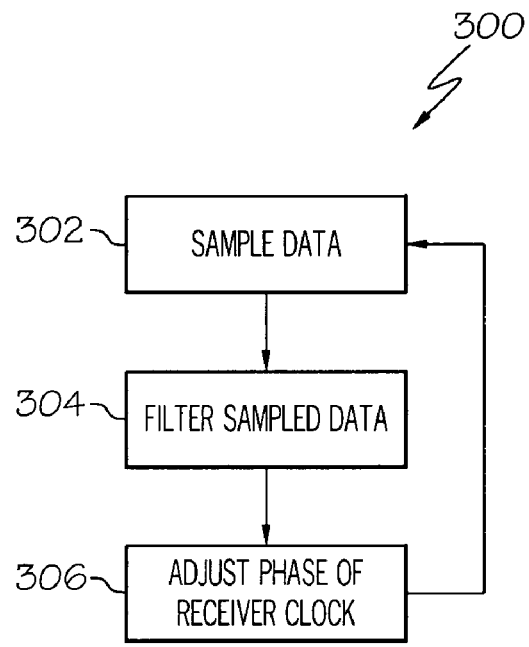
FIG. 3 depicts an embodiment of a flow chart for fine tracking of the incoming data in a DRC.

FIG. 3 shows a flow chart 300 of an embodiment for fine tracking of incoming data. Data received at an input port is sampled at least twice per unit interval (UI) (element 302).

The DRC filters the sampled data (element 304) to produce a control signal to cause an adjustment of the phase of the receiver clock (element 306). Adjustment of the receiver clock phase changes the point in a unit interval where a sample occurs. If the data eye advances with respect to the receiver clock, then the phase of the receiver clock is advanced. If the data eye retards with respect to the receiver clock, the phase of the receiver clock is retarded. This tends to keep a sample at about the center of the data eye. When there is low jitter in the incoming data stream, high accuracy adjustments in phase can be achieved using the fine tracking loop of the DRC.

Figure 4:
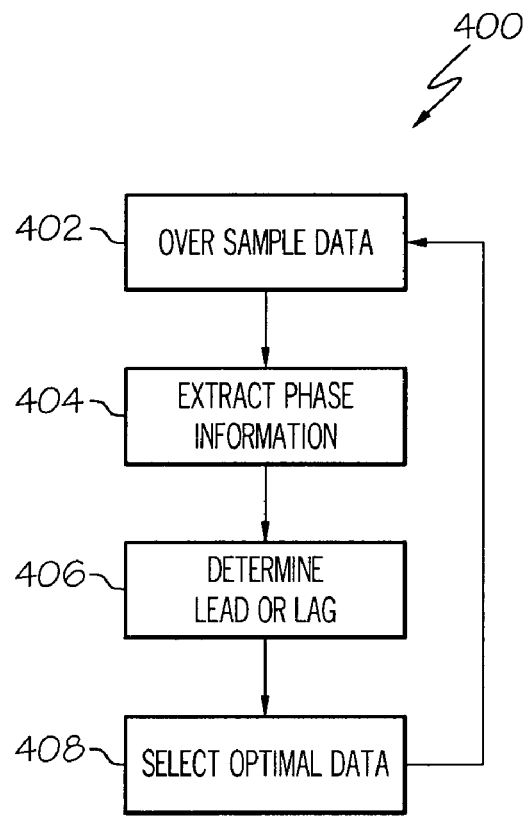
FIG. 4 depicts an embodiment of a flow chart for fast tracking of the incoming data in a DRC.

FIG. 4 shows a flow chart 400 of an embodiment for fast tracking of incoming data. The data received at the input port of the DRC is over-sampled, preferably with about 4 or more samples per UI (element 402). The phase detector of the DRC extracts the phase information from the sampled data (element 404). The DRC determines from the phase information whether the phase of the incoming data leads or lags the receiver clock phase (element 406). The DRC implements an algorithm to select the optimal data based on the phase information extracted from the over-sampled data. Thus, the DRC determines which of the samples of the over-sampled data best represents the data in the UI (element 408). When there is high frequency jitter in the incoming data stream, the fast tracking loop enables good tracking and recovery of the incoming data.

Figure 5:
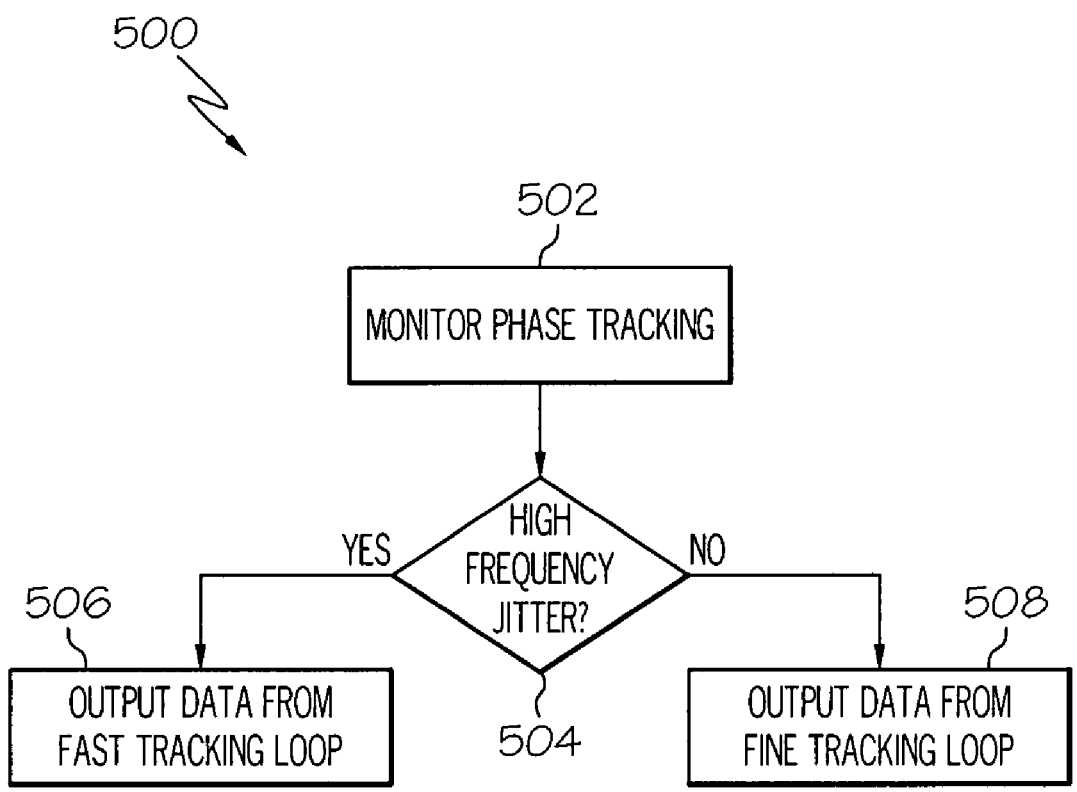
FIG. 5 depicts an embodiment of a flow chart for switching between data from the fine tracking loop and data from the fast tracking loop.

FIG. 5 shows a flow chart 500 of an embodiment for selecting between data from the fast tracking loop and data from the fine tracking loop. The DRC monitors phase tracking (element 502), and determines the presence of high frequency variations in the data phase (element 504). If there is high frequency jitter in the incoming data, as determined from the phase information extracted from the data, the DRC outputs data from the fast tracking loop (element 506). If there is not high frequency jitter in the incoming data, then the DRC outputs data from the fine tracking loop (element 508).

Thus, some embodiments comprise a method for recovering data from an incoming digital data stream in a data receiver circuit. The method comprises producing a local clock signal to sample the incoming digital data to produce a first set of samples and a second set of samples. The method further comprises recovering data in a fast tracking loop by choosing a preferred one of the samples of the first and second set of samples to represent the data. The method also comprises recovering data in a fine tracking loop by dynamically adjusting a receiver reference clock based on a received data phase of the first set of samples so that the receiver clock tracks an approximate center of a data eye.

In one embodiment, the method comprises selecting data from the fast tracking loop when there is sufficiently high frequency jitter in the received data, and otherwise selecting data from the fine tracking loop. In some embodiments, over-sampling of the digital data comprises delaying the receiver clock to produce the second set of samples. Data recovery in the fast tracking loop may comprise extracting phase information from the data. Data recovery in the fine tracking loop may comprise filtering the sampled data.

Present embodiments thus employ two loops to recover data: a fast tracking loop and a fine tracking loop. This overcomes disadvantages of using only a fast tracking loop or only a fine tracking loop. Using only a fast tracking loop, for example, overcomes errors due to high frequency jitter but leads to phase quantization error resulting from the limitation of maximum allowed over-sampling ratio in practical I/O circuits. Using only a fine tracking loop overcomes phase quantization error but leads to error due to jitter, among other things.

Present embodiments provide the advantages of both types of loops. When there is high frequency jitter, data may be obtained from the fast tracking loop, thereby limiting errors due to jitter, and when there is not high frequency jitter, data may be obtained from the fine tracking loop, thereby achieving high phase adjustment accuracy. Operating in the fine tracking mode may further reduce power consumption when low frequency tracking is possible due to low jitter in the incoming data stream.

The present invention and some of its advantages have been described in detail for some embodiments. It should be understood that various changes, substitutions and alterations can be made herein without departing from the spirit and scope of the invention as defined by the appended claims. An embodiment of the invention may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. One of ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

What is claimed is:

1. A data recovery circuit for receiving and recovering high speed digital data, comprising:
   a receiver clock to produce a local clock signal to sample the incoming digital data to produce a first set of samples and a second set of samples;
   a fast tracking loop to recover data by selecting a preferred one of the samples of the first and second set of samples, wherein the fast tracking loop comprises a decision matrix to compare a present optimal data selection control signal to a past optimal data selection control signal; and
   a fine tracking loop to recover data by dynamically adjusting a receiver reference clock based on a received data phase of the first set of samples to cause the receiver clock to track an approximate center of a data eye of the digital data.

2. The data recovery circuit of claim 1, further comprising a mode switch to switch between outputting data from the fast tracking loop and outputting data from the fine tracking loop.

3. The data recovery circuit of claim 1, wherein the fast tracking loop comprises a delay buffer to generate over-sampling clocks by delaying the clocks of the receiver clock to produce the second set of samples.

4. The data recovery circuit of claim 1, wherein the fast tracking loop comprises extra samplers to over-sample the incoming digital data to produce the second set of samples.

5. The data recovery circuit of claim 1, wherein the fast tracking loop comprises a phase detector to extract phase information from the sampled data.

6. The data recovery circuit of claim 1, wherein the fast tracking loop comprises a parallel phase accumulation adder to generate an optimal data selection control signal to select the optimal sample.

7. The data recovery circuit of claim 1, wherein the fast tracking loop comprises multiplexers to enable selection of a preferred sample of the first and second set of samples to represent the incoming data in a unit interval according to an optimal data selection control signal.

8. The data recovery circuit of claim 1, wherein the fine tracking loop comprises a phase interpolator to adjust the phase of the receiver clock.

9. The data recovery circuit of claim 8, wherein the fine phase tracking loop comprises a proportional filter to filter the sampled data and produce a control signal for the phase interpolator.

10. The data recovery circuit of claim 1, wherein data is selected from the fast tracking loop when there is high frequency jitter, and otherwise data is selected from the fine tracking loop.

11. A method for recovering data from an incoming digital data stream, comprising:
   producing a local clock signal to sample the incoming digital data to produce a first set of samples and a second set of samples;
   recovering data in a fast tracking loop of a circuit by choosing a preferred one of the samples of the first and second set, wherein recovering data in a fast tracking loop by choosing a preferred one of the samples of the first and second set comprises comparing, by a decision matrix, a present optimal data selection control signal to a past optimal data selection control signal; and
   recovering data in a fine tracking loop of the circuit by dynamically adjusting a receiver reference clock based on a received data phase of the first set of samples so that the receiver clock tracks an approximate center of a data eye.

12. The method of claim 11, further comprising selecting data from the fast tracking loop when there is high frequency jitter, and otherwise selecting data from the fine tracking loop.

13. The method of claim 11, wherein producing the second set of samples comprises delaying the receiver clock.

14. The method of claim 11, wherein recovering data in a fast tracking loop comprises extracting phase information from the data.

15. The method of claim 11, wherein recovering data in a fine tracking loop comprises filtering the sampled data.

16. A data recovery circuit for receiving and recovering high speed digital data, comprising:
   a receiver clock to produce a local clock signal to sample the incoming digital data to produce a first set of samples and a second set of samples;
   a fast tracking loop to recover data when there is high frequency jitter by selecting a preferred one of the samples of the first and second set of samples, wherein the fast tracking loop comprises a parallel phase accumulation adder to generate an optimal data selection control signal to select the optimal sample; and
   a fine tracking loop to recover data when there is not high frequency jitter by dynamically adjusting a receiver reference clock based on a received data phase of the first set of samples to cause the receiver clock to track an approximate center of a data eye of the digital data.

17. The data recovery circuit of claim 16, further comprising a mode switch to switch between outputting data from the fast tracking loop and outputting data from the fine tracking loop.

18. The data recovery circuit of claim 16, wherein the fast tracking loop comprises a delay buffer to generate over-sampling clocks by delaying the clocks of the receiver clock to produce the second set of samples.

19. The data recovery circuit of claim 16, wherein the fast tracking loop comprises extra samplers to over-sample the incoming digital data to produce the second set of samples.

20. The data recovery circuit of claim 16, wherein the fast tracking loop comprises multiplexers to enable selection of a preferred sample of the first and second set of samples to represent the incoming data in a unit interval according to an optimal data selection control signal.

* * * * *